(12) United States Patent
Liu et al.

(10) Patent No.: US 10,647,091 B2
(45) Date of Patent: May 12, 2020

(54) PLANAR GLASS SEALING STRUCTURE AND MANUFACTURING METHOD THEREOF

(71) Applicant: SHENZHEN CHINA STAR OPTOELECTRONICS TECHNOLOGY CO., LTD., Shenzhen, Guangdong (CN)

(72) Inventors: Yawei Liu, Guangdong (CN); Tai-pi Wu, Guangdong (CN); Chih-Che Liu, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 1116 days.

(21) Appl. No.: 14/115,369

(22) PCT Filed: Jun. 27, 2013

(86) PCT No.: PCT/CN2013/078145
§ 371 (c)(1),
(2) Date: Nov. 4, 2013

(87) PCT Pub. No.: WO2014/172997
PCT Pub. Date: Oct. 30, 2014

(65) Prior Publication Data
US 2014/0322458 A1    Oct. 30, 2014

(51) Int. Cl.
*B23K 1/00* (2006.01)
*B32B 17/06* (2006.01)
(Continued)

(52) U.S. Cl.
CPC ............ *B32B 17/061* (2013.01); *C03C 27/02* (2013.01); *C03C 27/08* (2013.01);
(Continued)

(58) Field of Classification Search
CPC ............ H01L 2224/16225; C08K 9/06; B23K 2035/008
(Continued)

(56) References Cited

U.S. PATENT DOCUMENTS 5,211,764 A * 5/1993 Degani .................. B23K 35/36
148/23
6,383,642 B1 * 5/2002 Le Bellac ................ B05D 1/62
427/162
(Continued)

FOREIGN PATENT DOCUMENTS

CN          1384695 A      12/2002
CN       101218692 A       7/2008
(Continued)

*Primary Examiner* — Erin B Saad
(74) *Attorney, Agent, or Firm* — Soroker Agmon Nordman (57) ABSTRACT

The present invention discloses a planar glass sealing structure and a manufacturing method thereof, the planar glass sealing structure comprises, in a top-down order: a first glass substrate, an insulating layer, a metal sealing frame and a second glass substrate. The insulating layer is formed as a frame shape, and disposed on a peripheral margin of the first glass substrate; the metal sealing frame is formed by heating to melt a metal solder layer between the first and second glass substrate, and it can keep a fixed gap between the first and second glass substrate, so that an inner space thereof is kept in an excellent sealed condition. The present invention can ensure the sealing structure of two correspondingly assembled glass substrates, so that the inner space thereof is insulated from moisture and oxygen, so as to increase the performance and quality of the device.

10 Claims, 5 Drawing Sheets

(51) Int. Cl.
*C03C 27/02* (2006.01)
*C03C 27/08* (2006.01)
*E06B 3/673* (2006.01)
*E06B 3/663* (2006.01)
*H01L 51/52* (2006.01)

(52) U.S. Cl.
CPC ...... *E06B 3/66357* (2013.01); *E06B 3/66376* (2013.01); *E06B 3/67326* (2013.01); *H01L 51/5243* (2013.01); *B32B 2457/202* (2013.01); *B32B 2457/206* (2013.01); *Y10T 428/1095* (2015.01); *Y10T 428/12396* (2015.01)

(58) Field of Classification Search
USPC ........... 257/794; 228/120, 121, 123.1, 124.5, 228/208
See application file for complete search history.

(56) References Cited

U.S. PATENT DOCUMENTS

| | | |
|---|---|---|
| 2005/0194899 A1 | 9/2005 | Matsuoka |
| 2007/0257598 A1* | 11/2007 | Yamada ................ B82Y 10/00 313/495 |
| 2008/0185701 A1* | 8/2008 | Foust .................... H01L 51/524 257/682 |

FOREIGN PATENT DOCUMENTS

| | | |
|---|---|---|
| CN | 101807672 A | 8/2010 |
| CN | 101847694 A | 9/2010 |
| CN | 102050585 A | 5/2011 |
| CN | 102557410 A | 7/2012 |
| CN | 102951857 A | 3/2013 |
| CN | 203200175 U | 9/2013 |

* cited by examiner

PLANAR GLASS SEALING STRUCTURE AND MANUFACTURING METHOD THEREOF

FIELD OF THE INVENTION

The present invention relates to a planar glass sealing structure and a manufacturing method thereof, and more particularly to a planar glass sealing structure and a manufacturing method thereof which seal an inner space of two correspondingly assembled glass substrates by heating to melt metal solder.

BACKGROUND OF THE INVENTION

In the field of display technology, a so-called flat panel display (FPD) technology comprises liquid crystal display (LCD) and organic light-emitting diode (OLED) display. The LCD displays images by using the material property of liquid crystal, and comparing with other display devices, it has advantages of lightweight, low driving voltage and low consumption, so it becomes a main stream product of the whole consuming market; and the main advantage of the OLED technology is active-light-emitting without backlight source, and it further has advantages of wide viewing angle, high contrast, low power, low power consumption, high reaction speed, true color and simple manufacturing process. Therefore, either the LCD display being a mature technology or the OLED display tending to usability can gradually replace an existing cathode ray tube (CRT) display. Furthermore, the OLED technology is also an important technological development trend of a flat light source except for the application of displays.

In technologies of the flat panel display and the flat light source, adhering two planar glasses is a very important technology, and the sealing effect thereof directly influences the performance and quality of the display. Generally speaking, in sealing technologies of the LCD and OLED, an existing ultraviolet rays (UV) curing technology is the earliest adopted technology, because it has features as follows: it is used without solvent or with a few solvent, so as to decrease the environmental pollution caused by solvent; it is low power consumption, and can be cured in low temperature, so it is suitable to use thermo-sensitive materials; and it has a fast curing speed, a high effect, so it can be used in high speed production line, so that the occupied area of the curing equipment is small; etc. However, the UV adhesive is an organic material, and the cured molecular gap thereof is greater, so that moisture and oxygen easily penetrate into the internal sealing area through the medium, so as to influence the performance and quality of the device.

As a result, it is necessary to provide a planar glass sealing structure and a manufacturing method thereof to solve the problems existing in the conventional technologies.

SUMMARY OF THE INVENTION

A primary object of the present invention is to provide a planar glass sealing structure and a manufacturing method thereof, so as to solve a sealing quality problems existing in the conventional technologies.

To achieve the above object, the present invention provides a planar glass sealing structure, which comprises:
  a first glass substrate;
  an insulating layer formed as a frame shape and disposed on a peripheral margin of a upper surface of the first glass substrate;
  a metal sealing frame formed as a frame shape and disposed over the insulating layer; and
  a second glass substrate disposed over the metal sealing frame and corresponding to the first glass substrate;
  wherein the first glass substrate and the second glass substrate have a fixed gap therebetween kept by the insulating layer and the metal sealing frame, and an inner space therebetween is kept in a sealed condition.

In one embodiment of the present invention, the insulating layer is an insulating layer of inorganic insulating material.

In one embodiment of the present invention, the inorganic insulating material is selected from silicon or silica.

In one embodiment of the present invention, the melting point of the material of the metal sealing frame is lower than the melting point of the first and second glass substrate.

In one embodiment of the present invention, the thermal expansion coefficient (COE) of the metal sealing frame is close or equal to the thermal expansion coefficient of the first and second glass substrate.

In one embodiment of the present invention, the materials of the metal sealing frame are selected from tin (Sn), tin alloy, indium (In) or iridium alloy.

In one embodiment of the present invention, a width of the metal sealing frame is smaller than a width of the insulating layer.

In one embodiment of the present invention, the planar glass sealing structure is a glass substrate structure of a flat light source or display of organic light-emitting diode (OLED); and the first glass substrate is an active glass substrate, and the second glass substrate is an encapsulation glass substrate.

In one embodiment of the present invention, the planar glass sealing structure is a glass substrate structure of liquid crystal display (LCD); and the first glass substrate is an array glass substrate, and the second glass substrate is a color filter substrate.

To achieve the above object, the present invention further provides a manufacturing method of a planar glass sealing structure, which comprises steps of:
  providing a first glass substrate;
  disposing a frame-shaped insulating layer on a peripheral margin of an upper surface of the first glass substrate;
  providing a second glass substrate;
  coating a frame-shaped metal solder layer on a peripheral margin of a lower surface of the second glass substrate, wherein a coated area of the metal solder layer is corresponding to an installing area of the insulating layer;
  correspondingly assembling the lower surface of the second glass substrate to the upper surface of the first glass substrate, wherein the metal solder layer is pressed onto the insulating layer; and
  heating to melt the metal solder layer to be respectively soldered with the second glass substrate thereabove and the first glass substrate thereunder, so as to form a metal sealing frame, and the first glass substrate and the second glass substrate have a fixed gap therebetween kept by the metal sealing frame, and an inner space thereof is kept in a sealed condition.

In one embodiment of the present invention, the step of correspondingly assembling the lower surface of the second glass substrate to the upper surface of the first glass substrate is processed under a vacuum environment.

To achieve the above object, the present invention further provides a planar glass sealing structure, wherein the planar glass sealing structure is a glass substrate structure of organic light-emitting diode flat light source or display, which comprises:

an active glass substrate;

an insulating layer formed as a frame shape and disposed on a peripheral margin of an upper surface of the active glass substrate;

a metal sealing frame formed as a frame shape and disposed over the insulating layer; and an encapsulation glass substrate disposed over the metal sealing frame and corresponding to the active glass substrate;

wherein the melting point of the material of the metal sealing frame is lower than the melting point of the active glass substrate and the encapsulation glass substrate; the thermal expansion coefficient of the metal sealing frame is close or equal to the thermal expansion coefficient of the active glass substrate and the encapsulation glass substrate; and the active glass substrate and the encapsulation glass substrate have a fixed gap therebetween kept by the insulating layer and the metal sealing frame, and an inner space thereof is kept in a sealed condition.

Hence, by using a metal solder layer as a seal material, the planar glass sealing structure and the manufacturing method thereof can ensure the sealing structure of two correspondingly assembled glass substrates, so that the sealing effect of the planar glass sealing structure can be insured, so as to increase the performance and quality of the device.

DETAILED DESCRIPTION OF THE PREFERRED EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inside, outer, side and etc., are only directions referring to the accompanying drawings, so that the used directional terms are used to describe and understand the present invention, but the present invention is not limited thereto.

Firstly explaining, for conveniently describing, the figures are shown in a way of schematic view, and some components which are unrelated to the explanation are omitted.

Figure 1A:
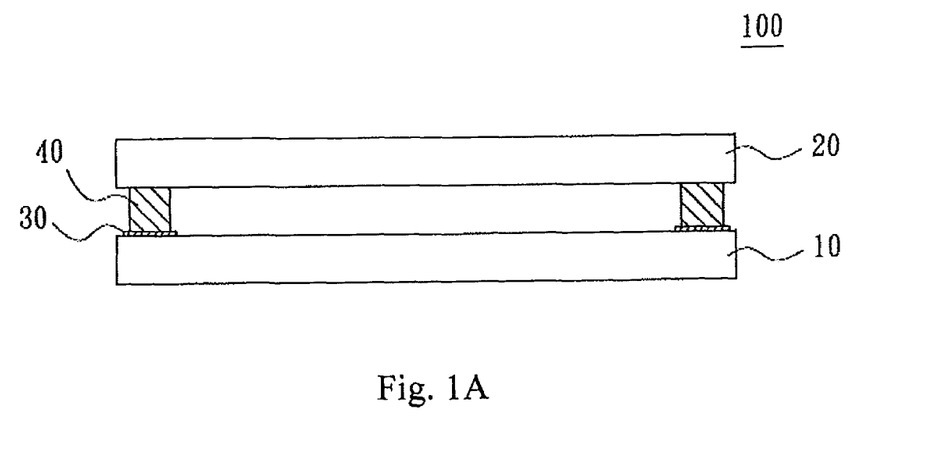
FIG. 1A is a cross-sectional side view of a planar glass sealing structure according to a first preferred embodiment of the present invention.
Figure 1B:
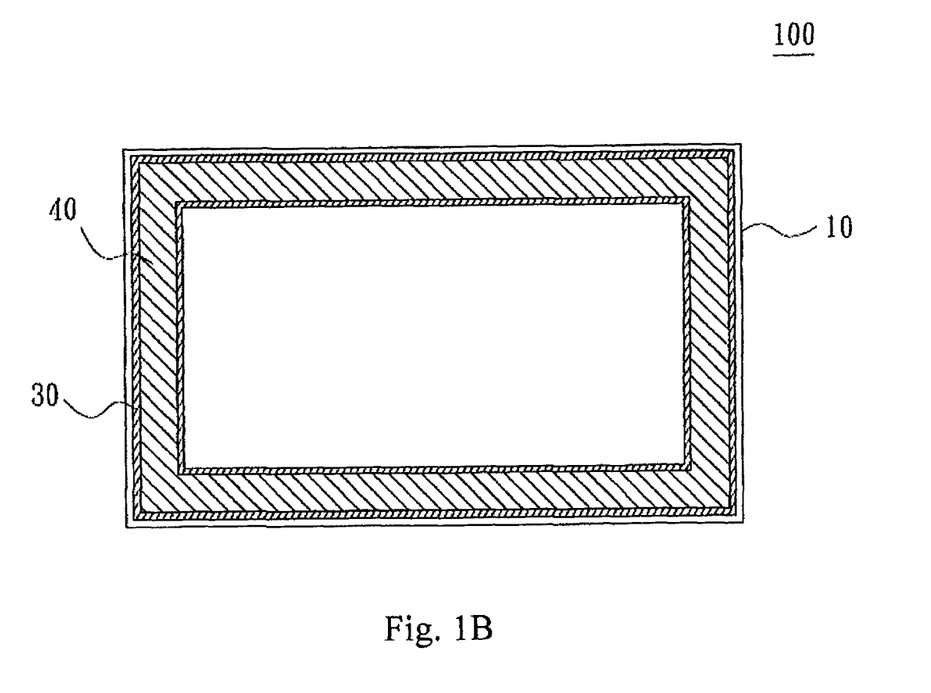
FIG. 1B is a top view of the planar glass sealing structure according to the first preferred embodiment of the present invention.

Referring now to FIGS. 1A and 1B, a cross-sectional side view of a planar glass sealing structure according to a first preferred embodiment of the present invention is illustrated in FIG. 1A; and a top view of the planar glass sealing structure according to the first preferred embodiment of the present invention is illustrated in FIG. 1B. For clearly showing the relation among internal structures, in the top view of the first preferred embodiment of FIG. 1B, it is excluded an glass substrate 20 on the top from a planar glass sealing structure 100, and an insulating layer 30 and a metal sealing frame 40 are shown in a way of section line. The planar glass sealing structure 100 according to the present invention is a planar glass sealing structure which mainly comprises two glass substrates (a first glass substrate 10 and a second glass substrate 20), and the planar glass sealing structure 100 can be a flat light source of organic light-emitting diode (OLED), an OLED display, a liquid crystal display (LCD) display, or other structures which are necessary to be a sealing structure between two glass substrates, so that it does not limited in the present invention.

As shown in FIGS. 1A and 1B, the planar glass sealing structure according to the first preferred embodiment of the present invention comprises, in a top-down order: a first glass substrate 10, an insulating layer 30, a metal sealing frame 40 and a second glass substrate 20. The first glass substrate 10 is such as a rectangular glass substrate; the insulating layer 30 is formed as a frame shape, and disposed on a peripheral margin of the first glass substrate 10 (as shown in FIG. 1B); the metal sealing frame 40 is corresponding to the insulating layer 30 formed as a frame shape, and disposed over the insulating layer 30; and the second glass substrate 20 is disposed over the metal sealing frame 40, of which size and shape correspond to the first glass substrate 10.

As shown in FIG. 1A, the first glass substrate 10 and the second glass substrate 20 have a fixed gap therebetween kept by the insulating layer 30 and the metal sealing frame 40, and an inner space thereof is kept in a sealed condition. Because the upper surface of the first glass substrate 10 possibly have to be provided with a certain number of circuit layers (not drawn) according to different devices thereof, the insulating layer 30 is preferably to be an insulating layer of inorganic insulating materials. For example, the inorganic insulating materials can be selected from silicon (Si) or silica ($SiO_2$), so that it can isolate between the metal sealing frame 40 and the first glass substrate 10 without direct contact, so as to avoid electrically connect to each other. Besides, as shown in FIG. 1B, the insulating layer 30 preferably has a distance from the edges of the first glass substrate 10, such as 5 millimeters (mm), but the distance is not limited in the present invention. In another possible embodiment of the present invention, the edges of the insulating layer 30 can be disposed to match together with the edges of the first glass substrate 10. Additionally, the metal sealing frame 40 is disposed over the insulating layer 30, and the width thereof is preferably smaller than the width of the insulating layer 30, so as to further insure that the metal sealing frame 40 does not directly contact with the first glass substrate 10.

Furthermore, for heating to form the metal sealing frame 40 between two planar glasses by using metal soldering manner, the soldering temperature can not be too high (the temperature of the soldering area can not over 900° C.). Besides, the thermal expansion coefficients of common used soldering metal are different from glass, so it will cause a stress problem. Therefore, in the present invention, the melting point of the material of the metal sealing frame 40 is preferably lower than the melting point of the first glass substrate 10 and the second glass substrate 20; and the thermal expansion coefficient of the metal sealing frame 40 is preferably close or equal to the thermal expansion coefficient of the first glass substrate 10 and the second glass substrate 20. By the above-mentioned request, the materials of the metal sealing frame 40 according to the present invention can be selected from tin (Sn), tin alloy, indium (In) or indium alloy.

As described above, because the metal sealing frame 40 can accomplish an excellent sealed condition between the first glass substrate 10 and the second glass substrate 20, the present invention can ensure the sealing structure which correspondingly assembled by two glass substrates, and more particularly ensure the technical fields of OLED flat light source or display which are sensitive to moisture and oxygen, so that the sealing effect of the planar glass sealing structure can be insured, so as to increase the performance and quality of the device.

Referring now to FIGS. 2A-2F, schematic views showing steps of a manufacturing method of the planar glass sealing structure according to the present invention are illustrated in FIGS. 2A-2F.

Figure 2A:
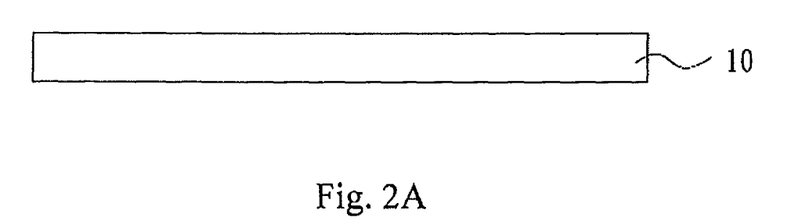
FIGS. 2A-2F are schematic views showing steps of a manufacturing method of the planar glass sealing structure according to the present invention.

Firstly, as shown in FIG. 2A, provide a first glass substrate 10.

Figure 2B:
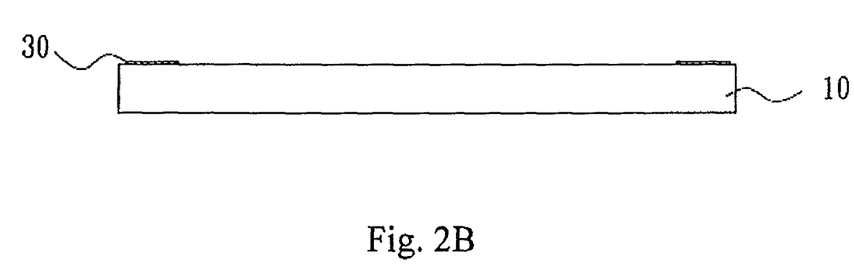

Next, as shown in FIG. 2B, dispose a frame-shaped insulating layer 30 around peripheral margin of the first glass substrate 10. The insulating layer 30 preferably is an inorganic insulating material (such as silicon or silica), but the method for installing the insulating layer 30 is not limited in the present invention.

Figure 2C:
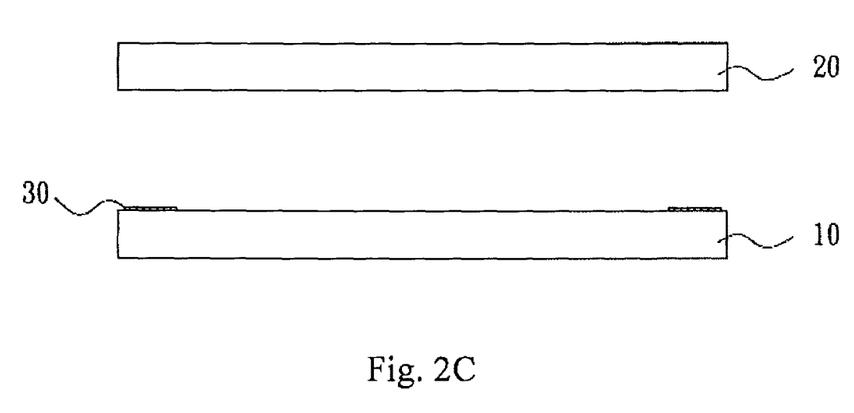

Further, as shown in FIG. 2C, provide a second glass substrate 20.

Figure 2D:
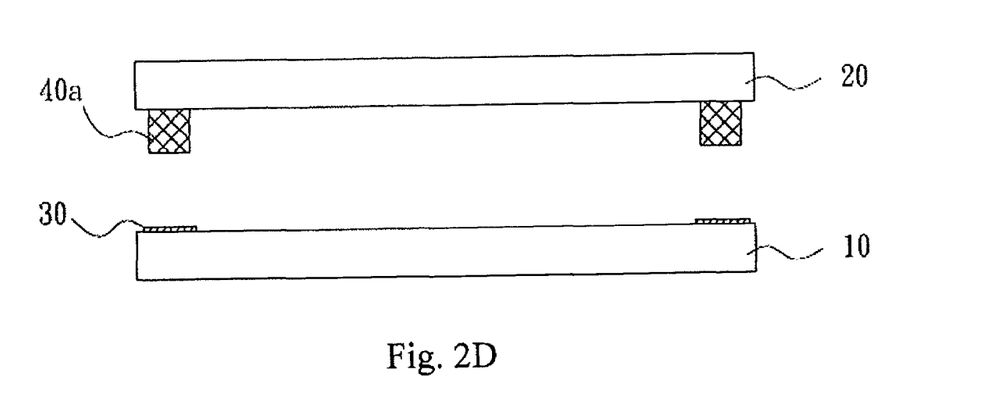

And then, as shown in FIG. 2D, coat a frame-shaped metal solder layer 40a on a peripheral margin of a lower surface of the second glass substrate 20, and the coated area of the metal solder layer 40a is corresponding to an installing area of the insulating layer 30. The metal solder layer 40a has a certain thickness, and the method of coating the metal solder layer 40a is such as follows: the metal solder is grinded as power, namely to adopt method of powder metallurgy, and a sinter of metal solder with default width and height is performed on the sealing glass. Alternatively, the metal solder is grinded as power; add into an organic solvent (such as alcohol) with certain viscosity; and compound it as a paste with certain viscosity, and coat the paste on the sealing glass, and then remove the organic solvent, so as to form a metal solder firm with certain width and height.

Figure 2E:
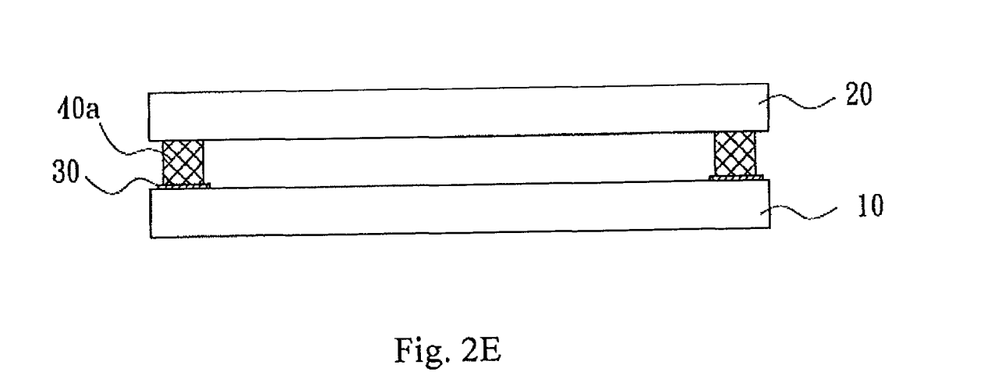

Furthermore, as shown in FIG. 2E, correspondingly assemble the lower surface of the second glass substrate 20 to the upper surface of the first glass substrate 10, and the metal solder layer 40a is pressed together with the insulating layer 30. Additionally, if it is necessary for manufacturing process, the steps of correspondingly assembled of the first glass substrate 10 and the second glass substrate 20 can be processed under a vacuum environment electively, so that an inner space of the planar glass sealing structure 100 can be kept in a vacuum condition.

Figure 2F:
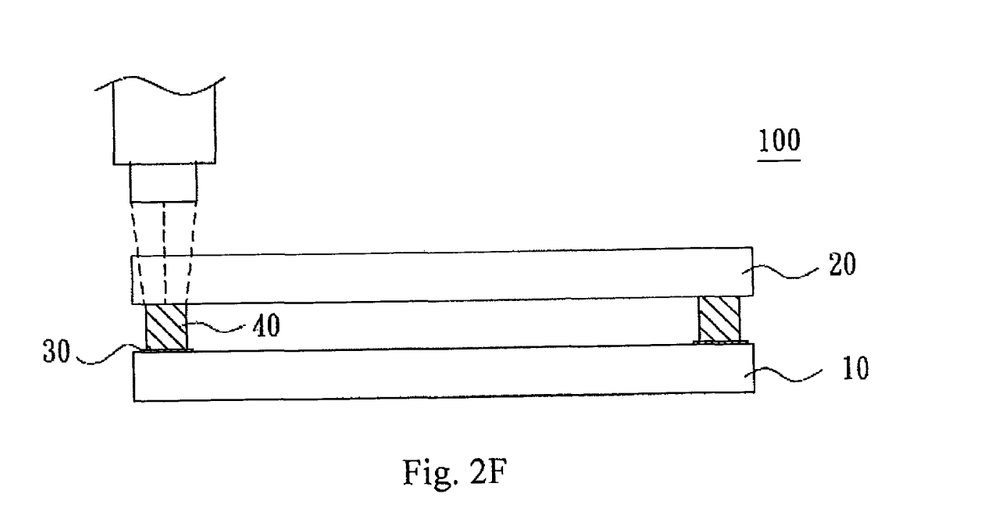

Finally, as shown in FIG. 2F, heat to melt the metal solder layer 40a to be respectively soldered with the second glass substrate 20 thereabove and the first glass substrate 10 thereunder so as to form a metal sealing frame 40, wherein the soldering of the metal solder layer 40a and the first glass substrate 10 is indirectly soldered by the insulating layer 30, so that the metal solder layer 40a does not electrically connect to the circuit layer on the first glass substrate 10. Additionally, the heating method of the metal solder layer 40a is not limited in the present invention. It is such as laser ray or other metal soldering methods. As shown in FIG. 2F, the laser ray is emitted from the upper surface of the second glass substrate 20 and focused onto the metal solder layer 40a, and is moved along a frame shape to continuously solder and heat to the metal solder layer 40a. After soldering, the first glass substrate 10 and the second glass substrate 20 have a fixed gap therebetween kept by the metal sealing frame 40, and an inner space thereof is kept in a sealed condition.

As described above, the metal sealing frame 40 can accomplish an excellent sealed condition between the first glass substrate 10 and the second glass substrate 20, so that the sealing effect of the planar glass sealing structure can be insured, so as to increase the performance and quality of the device.

Figure 3:
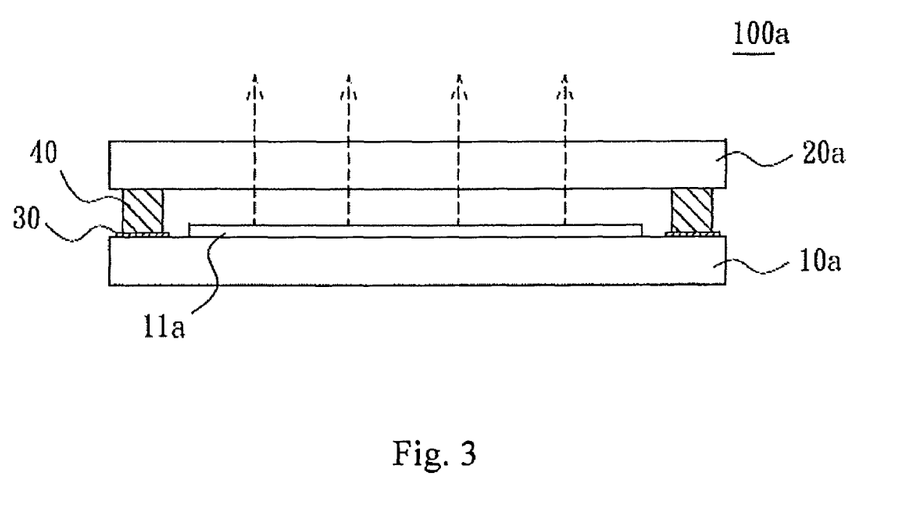
FIG. 3 is a cross-sectional side view of a planar glass sealing structure according to a second preferred embodiment of the present invention.

Referring now to FIG. 3, a cross-sectional side view of a planar glass sealing structure according to a second preferred embodiment of the present invention is illustrated in FIG. 3. A planar glass sealing structure 100a according to the second preferred embodiment of the present invention is a structure of OLED flat light source, and is substantially similar to the planar glass sealing structure 100 according to the first preferred embodiment of the present invention, so as to use similar terms and numerals, but the difference therebetween is that: in this preferred embodiment, the first glass substrate 10a is an active glass substrate; and the second glass substrate 20a is an encapsulation glass substrate, wherein the first glass substrate 10a is further provided with at least one OLED component 11a, and the OLED component 11a comprises a plurality of electrodes and organic layers (not drawn). Generally speaking, if working environment comprises oxygen and moisture, the OLED component 11a is easy damaged. Therefore, in this preferred embodiment, by using metal solder layer as the material of the metal sealing frame 40, it can be insured that a vacuum and sealed condition inside the planar glass sealing structure 100a of the OLED flat light source, so as to increase the performance and quality of the device.

Figure 4:
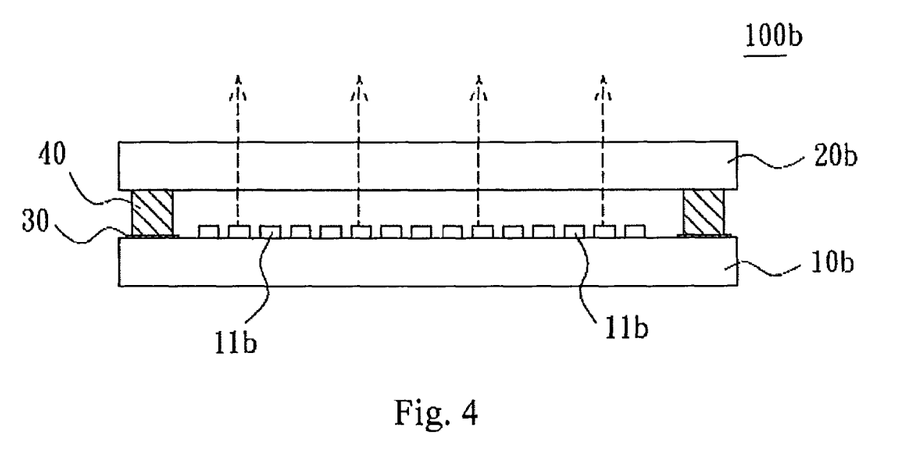
FIG. 4 is a cross-sectional side view of a planar glass sealing structure according to a third preferred embodiment of the present invention.

Referring now to FIG. 4, a cross-sectional side view of a planar glass sealing structure according to a third preferred embodiment of the present invention is illustrated in FIG. 4. A planar glass sealing structure 100b according to the third preferred embodiment of the present invention is a structure of OLED display, and is substantially similar to the planar glass sealing structure 100 according to the first preferred embodiment of the present invention, so as to use similar terms and numerals, but the difference therebetween is that: in this preferred embodiment, the first glass substrate 10b is an active glass substrate; and the second glass substrate 20b is an encapsulation glass substrate, wherein the first glass substrate 10b is further provided with a plurality of OLED components 11b, and the OLED components 11b comprise a plurality of electrodes and organic layers (not drawn). Therefore, in this preferred embodiment, by using metal solder layer as the material of the metal sealing frame 40, it can be insured that a vacuum and sealed condition inside the planar glass sealing structure 100a of the OLED flat light source, so as to increase the performance and quality of the device.

Figure 5:
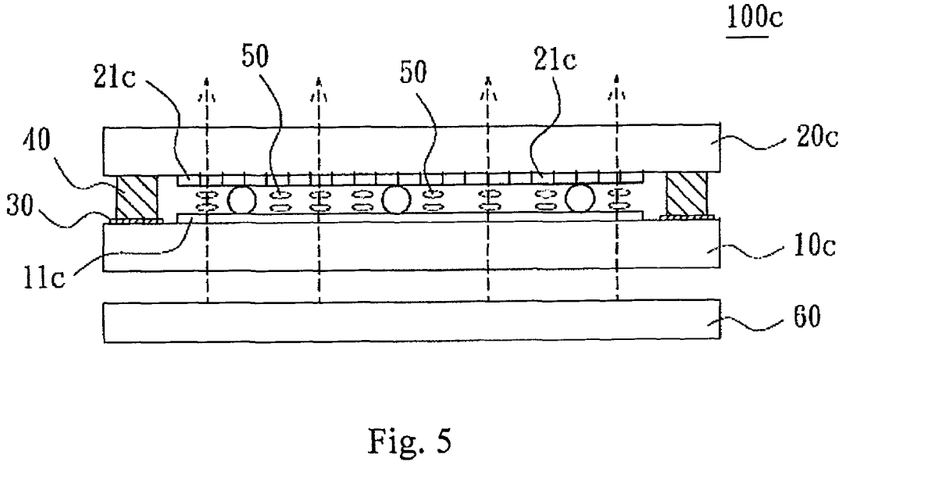
FIG. 5 is a cross-sectional side view of a planar glass sealing structure according to a fourth preferred embodiment of the present invention.

Referring now to FIG. 5, a cross-sectional side view of a planar glass sealing structure according to a forth preferred embodiment of the present invention is illustrated in FIG. 5. A planar glass sealing structure 100c according to the forth preferred embodiment of the present invention is a structure of LCD display, and is substantially similar to the planar glass sealing structure 100 according to the first preferred embodiment of the present invention, so as to use similar terms and numerals, but the difference therebetween is that: in this preferred embodiment, the first glass substrate 10c is an array glass substrate (TFT glass); and the second glass substrate 20c is a color filter substrate (CF glass), wherein the upper surface of the first glass substrate 10c is provided with TFT circuit layers 11c; the lower surface of the second glass substrate 20c is provided with color filter layers 12c; and before or after soldering of the metal sealing frame 40 the inner space of the planar glass sealing structure 100a of the LCD display can be injected into liquid crystal 50. Besides, the liquid crystal 50 can not emit by itself, so that the planar glass sealing structure 100c is further provided with a backlight source 60 thereunder. In this preferred embodiment, by using metal solder layer as the material of the metal sealing frame 40, it can be insured that a seating effect of the planar glass sealing structure 100c of the LCD display, so as to increase the performance and quality thereof.

As described above, in comparison with the existing ultraviolet rays (UV) curing technology, the UV adhesive is an organic material and the cured molecular gap is greater, so that moisture and oxygen are easy into the internal sealed area through the media, so as to influence the performance and quality of the device. In the planar glass sealing structure 100 according to the present invention, by using metal solder layer 40a as the material of the metal sealing frame 40, it can ensure the sealing structure of two correspondingly assembled glass substrates, such as OLED flat light source, OLED display, or LCD display, wherein it more particularly ensure the planar glass sealing assembly of OLED flat light source or display which are sensitive to moisture and oxygen.

The present invention has been described with a preferred embodiment thereof and it is understood that many changes and modifications to the described embodiment can be carried out without departing from the scope and the spirit of the invention that is intended to be limited only by the appended claims.

The invention claimed is:
1. A manufacturing method of a planar glass sealing structure, wherein the manufacturing method of a planar glass sealing structure comprises steps of:
   providing a first glass substrate;
   disposing a frame-shaped insulating layer on a peripheral margin of an upper surface of the first glass substrate;
   providing a second glass substrate;
   coating a frame-shaped solid metal solder layer on a peripheral margin of a lower surface of the second glass substrate, wherein a coated area of the solid metal solder layer is corresponding to an installing area of the insulating layer; and the metal solder layer is coated by:
      grinding a metal solder into powder and then using a powder metallurgy method to form a solid sinter of the metal solder with a certain width and height on the sealing glass; or
      grinding a metal solder into powder and then adding the powder into an organic solvent with a certain viscosity to compound it as a paste with a certain viscosity, and coating the paste on the sealing glass and then evaporating the organic solvent, so as to form a solid metal solder film with a certain width and height;
   correspondingly assembling the lower surface of the second glass substrate to the upper surface of the first glass substrate, wherein the metal solder layer is pressed onto the insulating layer; and
   heating to melt the metal solder layer to be respectively soldered with the second glass substrate thereabove and the first glass substrate thereunder, so as to form a metal sealing frame, and the first glass substrate and the second glass substrate have a fixed gap therebetween kept by the metal sealing frame, and an inner space thereof is kept in a sealed condition;
   wherein the solid metal solder layer is formed prior to the step of assembling the lower surface of the second glass substrate to the upper surface of the first glass substrate and the step of heating to melt the metal solder layer;
   wherein the certain width and height are maintained after the step of assembling the lower surface of the second glass substrate to the upper surface of the first glass substrate.

2. The manufacturing method of the planar glass sealing structure according to claim 1, wherein the step of correspondingly assembling the lower surface of the second glass substrate to the upper surface of the first glass substrate is processed under a vacuum environment.

3. The manufacturing method of the planar glass sealing structure according to claim 1, wherein the insulating layer is an insulating layer of inorganic insulating materials.

4. The manufacturing method of the planar glass sealing structure according to claim 3, wherein the inorganic insulating materials are selected from silicon or silica.

5. The manufacturing method of the planar glass sealing structure according to claim 1, wherein the melting point of the material of the metal sealing frame is lower than the melting point of the first and second glass substrate.

6. The manufacturing method of the planar glass sealing structure according to claim 5, wherein the thermal expansion coefficient of the metal sealing frame is close or equal to the thermal expansion coefficient of the first and second glass substrate.

7. The manufacturing method of the planar glass sealing structure according to claim 6, wherein the materials of the metal sealing frame are selected from tin, tin alloy, indium or indium alloy.

8. The manufacturing method of the planar glass sealing structure according to claim 1, wherein a width of the metal sealing frame is smaller than a width of the insulating layer.

9. The manufacturing method of the planar glass sealing structure according to claim 1, wherein the planar glass sealing structure is a glass substrate structure of organic light-emitting diode flat light source or display; and the first glass substrate is an active glass substrate and the second glass substrate is an encapsulation glass substrate.

10. The manufacturing method of the planar glass sealing structure according to claim 1, wherein the planar glass sealing structure is a glass substrate structure of liquid crystal display; and the first glass substrate is an array glass substrate and the second glass substrate is a color filter substrate.

* * * * *